United States Patent [19]

Houston et al.

[11] 4,159,213

[45] Jun. 26, 1979

[54] STRAIGHT, UNIFORM THERMALMIGRATION OF FINE LINES

[75] Inventors: Douglas E. Houston, Ballston Lake; Thomas R. Anthony; Harvey E. Cline, both of Schenectady, all of N.Y.

[73] Assignee: General Electric Company, Schenectady, N.Y.

[21] Appl. No.: 942,123

[22] Filed: Sep. 13, 1978

[51] Int. Cl.$^2$ .......................................... H01L 21/225
[52] U.S. Cl. .................................... 148/1.5; 148/171; 148/178; 148/188
[58] Field of Search ................ 148/1.5, 178, 188, 171

[56] References Cited

U.S. PATENT DOCUMENTS

| 3,897,277 | 7/1975 | Blumenfeld | 148/1.5 |
|---|---|---|---|
| 3,899,361 | 8/1975 | Cline et al. | 148/171 X |
| 3,899,362 | 8/1975 | Cline et al. | 148/172 X |
| 3,902,925 | 9/1975 | Anthony et al. | 148/177 X |
| 3,904,442 | 9/1975 | Anthony et al. | 148/186 X |
| 3,998,662 | 12/1976 | Anthony et al. | 148/187 X |
| 4,006,040 | 1/1977 | Cline et al. | 148/188 X |

*Primary Examiner*—G. Ozaki
*Attorney, Agent, or Firm*—Donald M. Winegar; Joseph T. Cohen; Charles T. Watts

[57] ABSTRACT

Straight, fine molten wires (<0.002") of a metal can be migrated through a solid, or matrix, body of semiconductor material by initiation of the migration of the melt and continuing the migration along a thermal gradient established and maintained at from 2° to 10° off the normally preferred crystal axis of migration by the thermal gradient zone melting processing.

10 Claims, No Drawings

STRAIGHT, UNIFORM THERMALMIGRATION OF FINE LINES

BACKGROUND OF THE INVENTION

1. Field of the Invention

This invention relates to a method of migrating a melt of a metal through a solid body of semiconductor material by thermal gradient zone melting (TGZM) and, in particular, to the uniform initiation of migration by enhancing the penetration of melts into the material at the surface where fine liquid wires are being migrated.

2. Description of the Prior Art

W. G. Pfann in U.S. Pat. Nos. 2,813,048 and 2,739,088 describes methods for practicing the movement of melts of metal through particular regions of a solid body of semiconductor material by thermal gradient zone melting. However, molten line and droplet in stability resulted in the breakup of the migrating lines and droplets and consequently acceptable semiconductor devices were not always obtainable.

Recently, Thomas R. Anthony and Harvey E. Cline discovered that preferred planar orientations of the surfaces of the body of semiconductor material, migration axis and line orientation axes relationships were also a necessity to migrate liquid metal wires and/or droplets through the solid body (See U.S. Pat. Nos. 3,899,362 and 3,904,442, for example.) These improvements in TGZM resulted in commercialization of the process. However, as the width of the lines being migrated becomes smaller, the penetration of fine liquid lines of less than 2 mils in width, and preferably 1 mil in width, and small liquid droplets, less than 6 mils in diameter, from the surface of a wafer or body of semiconductor material has been difficult to achieve repeatedly on a commercial basis by a thermal gradient alone. Although a thermal gradient is strong enough to cause migration of the small liquid zones once they are formed in the bulk of semiconductor material, the thermal gradient force is not powerful enough to overcome the surface tension forces holding fine liquid zones, or wires, on the surface of a body, or wafer. Despite further improvements to the TGZM processing techniques, including alloying the deposited metal to the surface (U.S. Pat. No. 3,897,277) and sintering of the same (U.S. Pat. No. 4,006,040), the problem still persists as one attempts to migrate fine wires on a commercial basis. As a result, TGZM to date has been limited to line dimensions typical of isolation grids in solid state power devices and has not had any commercial impact on integrated-circuit type devices which require much finer doped region geometries.

Therefore, it is an object of this invention to provide a new and improved method to migrate fine molten lines or wires of metal through a solid body of semiconductor material by thermal gradient zone melting (TGZM) processing which overcomes the deficiencies of the prior art.

Another object of this invention is to provide a new and improved method to migrate fine molten wires of metal through a solid body of semiconductor material by thermal gradient zone melting (TGZM) processing which utilizes an off-axis thermal gradient.

Other objects of this invention will, in part, be obvious and will, in part, appear hereinafter.

BRIEF DESCRIPTION OF THE INVENTION

In accordance with the teachings of this invention, there is provided a new and improved method for migrating molten wires of metal of 2 mils or less through a solid body, or matrix, of semiconductor material. The improved method consists of establishing and maintaining an unidirectional thermal gradient at from 2° to 10° off-axis of the normally preferred axis of thermal migration. When the body has a major surface of (100) preferred planar crystal orientation, the thermal gradient is established and maintained in the body in a direction which is off the $<100>$ axis of the matrix body crystal toward a direction selected from the group consisting of the $<01\bar{1}>$ and the $<0\bar{1}1>$ directions.

Melts of aluminum wires 2 mils and less in width have been successfully migrated. The metal penetrated uniformly along the entire length of each wire at the initiation of migration. The wires were stable during migration and each wire in wire arrays penetrated to substantially the same depth during the same duration of time of migration.

DESCRIPTION OF THE INVENTION

A body of semiconductor material is selected for a particular level of resistivity and a first type conductivity. The body has opposed major surfaces which are the top and bottom surfaces respectively thereof. The semiconductor material comprising the body may be silicon, germanium, silicon carbide, gallium arsenide, a compound of a Group II element and a Group VI element, and a compound of a Group III and a Group V element.

The thermal migration of metal wires is preferably practiced in accordance with the planar orientations, thermal migration directions, stable wire directions and stable wire sizes of the following Table:

| Wafer Plane | Migration Direction | Stable Wire Directions | Stable Wire Sizes |
|---|---|---|---|
| (100) | $<100>$ | $<011>$* | $<100$ microns |
|  |  | $<0\bar{1}1>$ | $<100$ microns |
| (110) | $<110>$ | $<1\bar{1}0>$* | $<150$ microns |
| (111) | $<111>$ | (a) $<01\bar{1}>$ |  |
|  |  | $<10\bar{1}>$ | $<500$ microns |
|  |  | $<1\bar{1}0>$ |  |
|  |  | (b) $<11\bar{2}>$* |  |
|  |  | $<\bar{2}11>$ | $<500$ microns |
|  |  | $<1\bar{2}1>$ |  |
|  |  | (c) Any other* direction in (111) plane | $<500$ microns |

*The stability of the migrating wire is sensitive to the alignment of the thermal gradient with the $<100>$, $<110>$ and $<111>$ axis, respectively.
Group a is more stable than group b which is more stable than group c.

The temperature gradient zone melting process and apparatus is not a part of this invention. For a more thorough understanding of the temperature gradient zone melting process employed in this invention and for a more thorough description of the apparatus employed for this process, one is directed to the following U.S. Patents entitled "Method of Making Deep Diodes", U.S. Pat. No. 3,901,736; "Deep Diode Device and Method", U.S. Pat. No. 3,902,925; "Deep Diode Devices and Method and Apparatus", U.S. Pat. No. 4,091,257; "High Velocity Thermomigration Method of Making Deep Diodes", U.S. Pat. No. 3,898,106; "The Stabilized Droplet Method of Making Deep Diodes Having Uniform Electrical Properties", U.S. Pat. No. 3,899,361; Method of Making Isolation Grids in Bodies of Semiconductor Material, U.S. Pat. No. 3,979,230; and Thermomigration of Metal-Rich Liquid Wires Through Semiconductor Materials, U.S. Pat. No. 3,899,362.

We have discovered that an off-axis thermal gradient can be utilized to initiate and migrate fine liquid wires through a solid body of semiconductor material. The stability of the migrating fine liquid wire during migration is maintained.

Although it did not appear pertinent at first, the teachings of Anthony and Cline in "Random Walk of Liquid Droplets Migrating in Silicon", *Journal of Applied Physics,* 47, 2316 (1976) was reviewed and it was discovered that in a similar relationship of the off-axis thermal gradient relative to migrating droplets through a solid body, the same principles could be made to aply to migrating fine liquid wires. The thermal gradient is established at from 2° to 10° off the preferred crystal axis of migration shown in the table. We discovered that all fine metal wires initiated uniformly, and together, and stably migrated through the solid body. Thus, it has been established that preferential dissolution is being practiced at one of the forward faces of the migrating molten wire as it is always at a higher average temperature than the other faces of the migrating wire. The off-axis thermal gradient prevents the random dislocation-induced sideways displacements which are observed when the thermal gradient is parallel to the preferred crystal axis of migration. Therefore, a steady non-random displacement of the migrating molten wire in a direction dictated by the slightly off-axis thermal gradient is successfully achieved and results in arrays of fine lines of 2 mils in width and less.

We prefer to utilize wafers having a (100) planar crystal orientation and a <100> preferred crystal axis of migration. In our U.S. Pat. No. 3,998,662 entitled "Migration of Fine Lines For Bodies of Semiconductor Materials Having A (100) Planar Orientation of A Major Surface", we teach that with a wafer of (100) planar orientation, the molten wires tend to be self-initiating in migrating and as a result less sideways displacement occurs. Consequently, the width of the migrating wire remains almost the same width as the deposited layer of metal whereas with the other planar orientations the recrystallized regions produced are greater in width than the wires deposited and the regions produced in (100) planar oriented wafers.

In our investigations of migrating aluminum through silicon we discovered that with (100) planar crystal orientation the resulting thin regions of recrystallized semiconductor material were occasionally wavy in its configuration and the metal of each wire did not always initiate simultaneously resulting in broken lines and/or more non-uniform depth of penetration during the same predetermined time of practicing thermal gradient zone melting.

Therefore, by applying the principles of employing 2° to 10° off-axis material we were able to reproducibly form aluminum-doped regions of recrystallized silicon semiconductor material of 2 mil width and less. The thermal gradient is established and maintained as a unidirectional thermal gradient in the solid, or matrix, body in a direction from 2° to 10° off the <100> axis of the matrix body crystal toward a direction selected from the group consisting of the <011> and the <011> directions. For example, we migrated 2 mil wide aluminum wires through silicon wafers cut 4°±0.5° off the <100> crystal axis of migration. The crystal axis of <011> direction was utilized as the axis of rotation. The thermal gradient was directed perpendicular to the opposed major surfaces of the wafers and resulted in an off-axis component in the <011> direction. The metal was deposited on the wafer surfaces parallel to the <011> crystal axis direction.

The thermal migration of the array of lines resulted in a uniform penetration of the surface along the entire length of each metal wire. As a result, the array of metal wires migrated uniformly and by examination of wafers wherein migration was practiced at various lengths of time, the depth of migration was uniform for each line and substantially the same, in general, for all lines in the array with respect to each other.

Preferably, the unidirectional thermal gradient is maintained within 2° to 10° off the preferred crystal axis of migration for the stable wire directions. The greater the component of off-axis migration becomes, provided it is not in the same crystal plane as the stable wire, the greater the tendency is for the migrating line to become unstable during migration although uniformity of melt penetration is achieved.

There is one exception however. Stable metal wires of aluminum have been migrated through silicon wafers having a planar orientation of (111), stable wire directions of <11$\bar{2}$>, <$\bar{2}$11>, and <1$\bar{2}$1>, and an off-axis component of up to 50°. This cannot be done with the other stable wire directions for (111) wafers.

The off-axis migration may be achieved by deliberately cutting the wafers a predetermined amount off-axis. Therefore, when the unidirectional thermal gradient is established perpendicular to the two major surfaces of the wafer or matrix body, it will be at the prescribed number of degrees for the off-axis component of the desired crystal axis.

Having established the practicality of employing the off-axis thermal gradient technique of migration, we can then practice thermal gradient zone melting as described in the prior art.

The surface of the body of semiconductor material is prepared by usual semiconductor processing techniques for deposition of the metal to be migrated through the solid body of material. The metal may be deposited by any suitable means on the surface of initiation of melt migration. For example, when the body is of N-type silicon semiconductor material and the melt to be migrated comprises at least in part aluminum, it has been discovered that the vapor deposition of the layer of aluminum metal should be performed at a pressure of approximately $1 \times 10^{-5}$ torr but not greater than $5 \times 10^{-5}$ torr. When the pressure is greater than $5 \times 10^{-5}$ torr, we have found that in the case of aluminum metal vapor deposited, the aluminum does not easily penetrate into the silicon and migrate through the body. It is believed that the layer of aluminum is saturated with oxygen and prevents reduction by the aluminum metal of the very thin silicon oxide layer between the deposited aluminum and the silicon. Thus, the initial melt of aluminum and silicon required for migration is not obtained because of the inability of the aluminum layer to wet and alloy with the underlaying silicon. In a similar manner, the aluminum deposited by sputtering is not as desirable, as sputtered aluminum appears to be saturated with oxygen from the sputtering process, thereby preventing the reduction of any intervening silicon oxide. The preferred methods of depositing aluminum on the silicon body are by the electron beam method and the like wherein little, if any, oxygen can be trapped in the aluminum.

The processed body is placed in apparatus suitable for thermal gradient zone melting processing and the metal wires migrated through the solid body of semiconductor material.

Having established this off-axis thermal gradient technique for migrating metal wires of 2 mils width and less, we are able to successfully make semiconductor devices embodying fine line technology for forming regions of thin (2 mils or less) cross-section.

Other geometric configurations can also be successfully migrated by TGZM processing wherein the cross-sectional area of the initital metal configuration has a width dimension of 2 mils or less. Such configurations include circles for off-axis material of (111) planar orientation.

We claim as our invention:

1. In the method of moving a melt of metal-rich semiconductor material through a solid body of semiconductor material by thermal gradient zone melting processing comprising the steps of
   a. selecting a body of single crystal semiconductor material so that the body has a first type conductivity, a selected resistivity, and at least one major surface having a preferred planar crystal structure orientation which is one selected from the group consisting of (100), (110) and (111), the vertical axis of the body being substantially aligned with a first axis of the crystal structure;
   b. preparing the surface having the preferred planar crystal structure orientation to accommodate one or more physical configurations of a layer of metal thereon;
   c. depositing at least one amount of material in the form of a metal wire on the selected surface of the body of semiconductor material, each amount of metal material having a preferred geometric configuration;
   d. heating the body and the metal to a temperature sufficient to form a melt of metal-rich material on the surface of the body;
   e. establishing a temperature gradient along substantially the vertical axis of the body and the first axis of the crystal structure;
   f. migrating the metal-rich melt through the body along the first axis of the crystal structure to divide the body into a plurality of regions of first type conducitivity and to form at least one or more regions of recrystallized material of the body having solid solubility of the vapor deposited metal therein, the metal including at least one dopant impurity material therein to impart a second and opposite type conductivity and a selected level of resistivity thereto, the improvement in the method of processing which includes establishing the thermal gradient at from 2° to 10° off the vertical crystal axis of the body to obtain substantially uniform initiation of the melt for migration into and through the body.

2. The improved method of claim 1 wherein
the preferred planar crystal orientation is (100) and the off-axis thermal gradient is unidirectionally established in a direction off the $<100>$ crystal axis toward a direction which is one selected from the group consisting of $<01\bar{1}>$ and $<0\bar{1}1>$ directions.

3. The improved method of claim 1 wherein
the semiconductor material is silicon, and the metal of the layer is aluminum.

4. The improved method of claim 2 wherein
the semiconductor material is silicon, and the metal of the layer is aluminum.

5. The improved method of claim 4 wherein
the thermal gradient established is 4°±0.5° off the $<100>$ crystal axis.

6. The improved method of claim 1 wherein
the layer of metal has a wire-like configuration, and
the metal wire has a stable wire direction which is oriented to substantially coincide with at least one of the other axes of the crystal structure of the body wherein
when the preferred planar orientation is (111) the orientation of each metal wire coincides with any of the stable wire directions,
when the preferred planar orientation is (100) the orientation of each wire is at least one of the wire directions selected from the group consisting of $<011>$ and $<0\bar{1}1>$, and
when the preferred planar orientation is (110) the orientation of each wire is $<1\bar{1}0>$.

7. The improved method of claim 2 wherein
the layer of metal has a wire-like configuration which has a stable wire direction which is oriented to substantially coincide with one of the wire directions selected from the group consisting of $<011>$ and $<0\bar{1}1>$.

8. The improved method of claim 6 or 7 wherein
the semiconductor material is silicon, and
the metal of the layer is aluminum.

9. The improved metal of claim 8 wherein
the thermal gradient established is 4°±0.5° off the $<100>$ crystal axis.

10. The improved method of claim 3 wherein
the preferred planar orientation is (111) and the stable wire direction is one selected from the group consisting of $<11\bar{2}>$, $<\bar{2}11>$ and $<1\bar{2}1>$.

* * * * *